United States Patent
Sugawara

(10) Patent No.: US 10,431,947 B2
(45) Date of Patent: Oct. 1, 2019

(54) ELECTRICAL COMPONENT SOCKET

(71) Applicant: ENPLAS CORPORATION, Kawaguchi-shi, Saitama (JP)

(72) Inventor: Yuta Sugawara, Kawaguchi (JP)

(73) Assignee: ENPLAS CORPORATION, Saitama (JP)

(*) Notice: Subject to any disclaimer, the term of this patent is extended or adjusted under 35 U.S.C. 154(b) by 0 days.

(21) Appl. No.: 15/771,745

(22) PCT Filed: Oct. 26, 2016

(86) PCT No.: PCT/JP2016/081691
§ 371 (c)(1),
(2) Date: Apr. 27, 2018

(87) PCT Pub. No.: WO2017/073599
PCT Pub. Date: May 4, 2017

(65) Prior Publication Data
US 2018/0331481 A1  Nov. 15, 2018

(30) Foreign Application Priority Data
Oct. 28, 2015  (JP) .................................. 2015-211766

(51) Int. Cl.
*H01R 33/76* (2006.01)
*G01R 31/26* (2014.01)
(Continued)

(52) U.S. Cl.
CPC .......... *H01R 33/765* (2013.01); *G01R 1/0433* (2013.01); *G01R 31/26* (2013.01);
(Continued)

(58) Field of Classification Search
CPC .............. H01R 33/765; H01R 33/7685; H01R 13/2435; H01R 12/7076; H01R 2201/20;
(Continued)

(56) References Cited

U.S. PATENT DOCUMENTS 6,045,382 A    4/2000  Tohyama et al.
6,799,976 B1 * 10/2004  Mok .................. G01R 1/07371
                                                 439/55
(Continued)

FOREIGN PATENT DOCUMENTS

JP    10-172704    6/1998
JP    2005-24491   1/2005
(Continued)

OTHER PUBLICATIONS

International Search Report dated Dec. 13, 2016, in corresponding International Patent Application No. PCT/JP2016/081691.
(Continued)

*Primary Examiner* — Truc T Nguyen
(74) *Attorney, Agent, or Firm* — Staas & Halsey LLP

(57) ABSTRACT

An electrical component socket includes a socket body arranged on a circuit board and including a receiving portion configured to receive an electrical component. The socket body includes an arrangement portion in which a row of contact pins to be in contact with leads of an IC package is arranged. At least one of these contact pins and another one of the contact pins adjacent to the at least one of the contact pins have an arrangement pitch that is narrower than a pitch between the terminals of the electrical component, and the other one of the contact pins and still another one of the contact pins adjacent to the other one of the contact pins have an arrangement pitch that is substantially equal to the pitch between the terminals of the electrical component.

16 Claims, 8 Drawing Sheets

(51) Int. Cl.
*G01R 1/04* (2006.01)
*H01R 12/71* (2011.01)
*H01R 13/24* (2006.01)
*H01R 12/70* (2011.01)

(52) U.S. Cl.
CPC ..... *H01R 33/7685* (2013.01); *H01R 12/7076* (2013.01); *H01R 12/714* (2013.01); *H01R 12/716* (2013.01); *H01R 13/2435* (2013.01); *H01R 13/2471* (2013.01); *H01R 2201/20* (2013.01)

(58) Field of Classification Search
CPC .............. H01R 13/2471; H01R 12/714; H01R 12/716; G01R 1/0433; G01R 31/26
See application file for complete search history.

(56) References Cited

U.S. PATENT DOCUMENTS

| | | | | |
|---|---|---|---|---|
| 7,254,889 | B1* | 8/2007 | Cherian | G01R 1/0466 |
| | | | | 257/E23.048 |
| 9,459,283 | B2* | 10/2016 | Tomioka | G01R 1/0466 |
| 2002/0192989 | A1* | 12/2002 | Ling | H01R 13/53 |
| | | | | 439/108 |
| 2004/0242057 | A1* | 12/2004 | Deford | H05K 7/1069 |
| | | | | 439/526 |
| 2005/0196987 | A1* | 9/2005 | Shuey | H01R 13/6471 |
| | | | | 439/108 |
| 2005/0260867 | A1* | 11/2005 | Ono | H05K 1/144 |
| | | | | 439/65 |
| 2007/0264846 | A1 | 11/2007 | Takagi | |
| 2008/0227310 | A1* | 9/2008 | Too | H01L 23/433 |
| | | | | 439/74 |
| 2010/0291774 | A1* | 11/2010 | Cheng | H01R 13/2435 |
| | | | | 439/66 |
| 2011/0014802 | A1* | 1/2011 | Demuynck | H01L 23/32 |
| | | | | 439/68 |
| 2011/0201234 | A1* | 8/2011 | Long | H01R 12/721 |
| | | | | 439/630 |
| 2011/0275228 | A1* | 11/2011 | Niitsu | H01R 12/716 |
| | | | | 439/65 |
| 2011/0281445 | A1* | 11/2011 | MacDougall | H01R 12/7076 |
| | | | | 439/68 |
| 2012/0083169 | A1* | 4/2012 | Heng | H05K 7/1084 |
| | | | | 439/660 |
| 2012/0295484 | A1* | 11/2012 | Sato | H01R 13/22 |
| | | | | 439/626 |
| 2018/0331481 | A1* | 11/2018 | Sugawara | G01R 31/26 |

FOREIGN PATENT DOCUMENTS

| | | |
|---|---|---|
| JP | 2007-304051 | 11/2007 |
| WO | WO 2012/067125 A1 | 5/2012 |

OTHER PUBLICATIONS

International Written Opinion dated Dec. 13, 2016, in corresponding International Patent Application No. PCT/JP2016/081691.

* cited by examiner

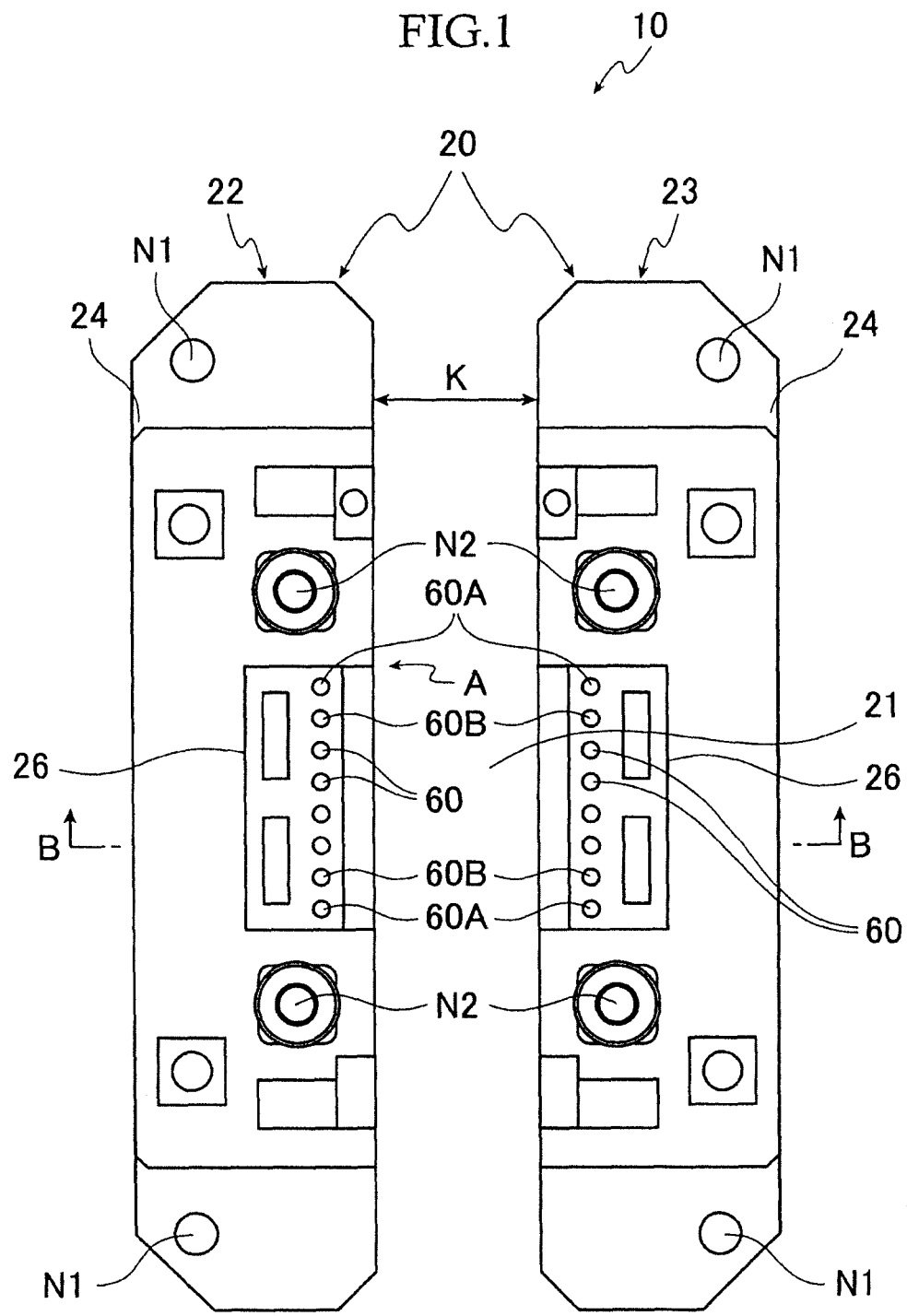

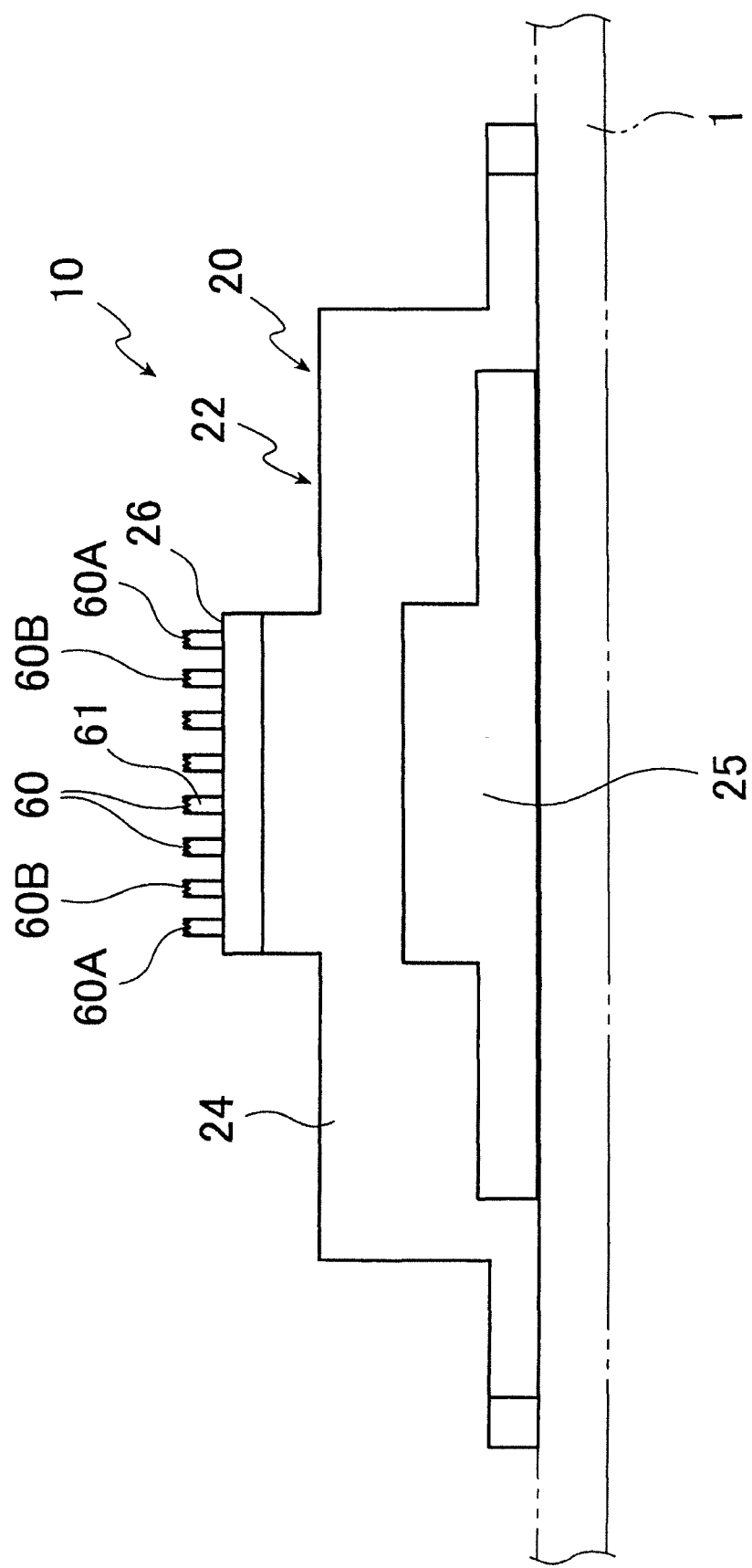

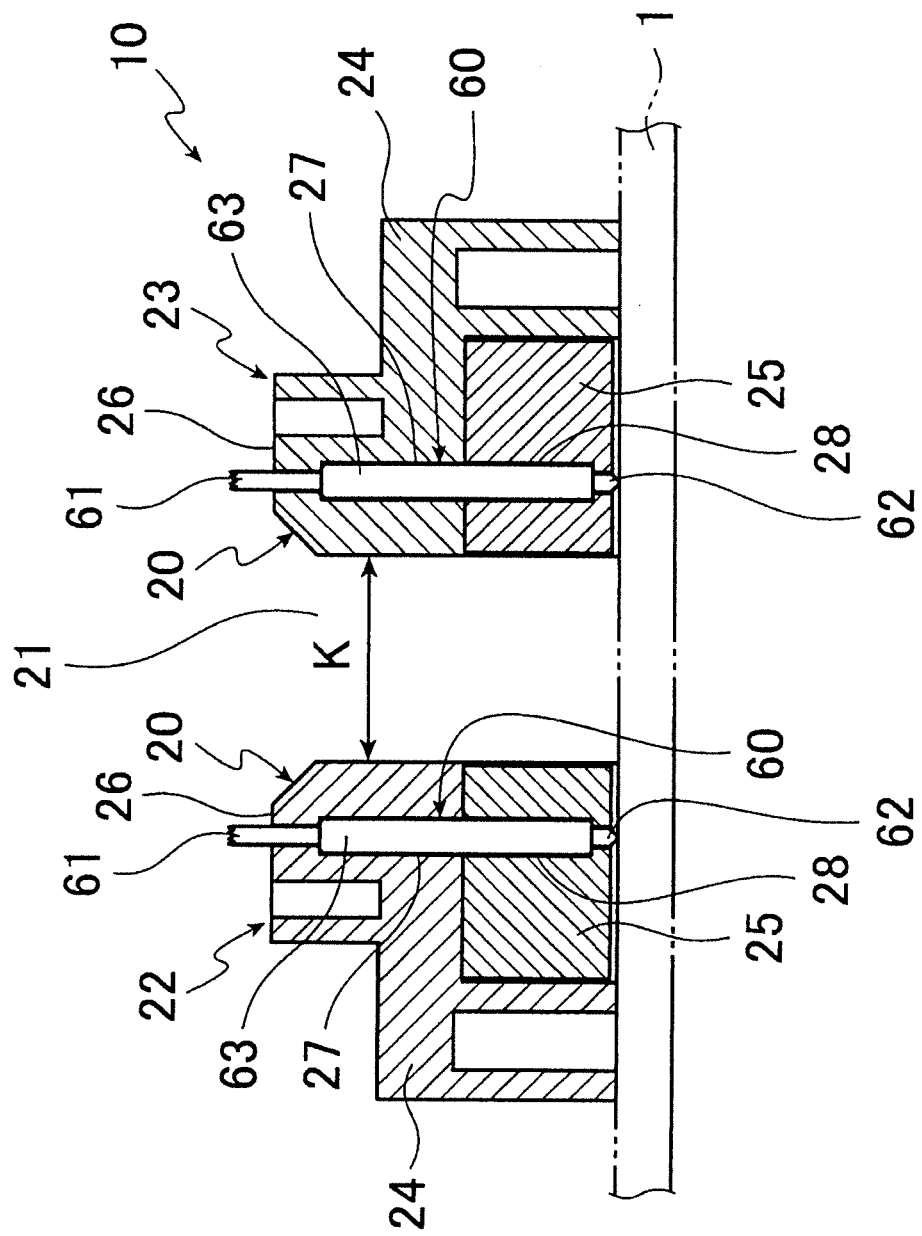

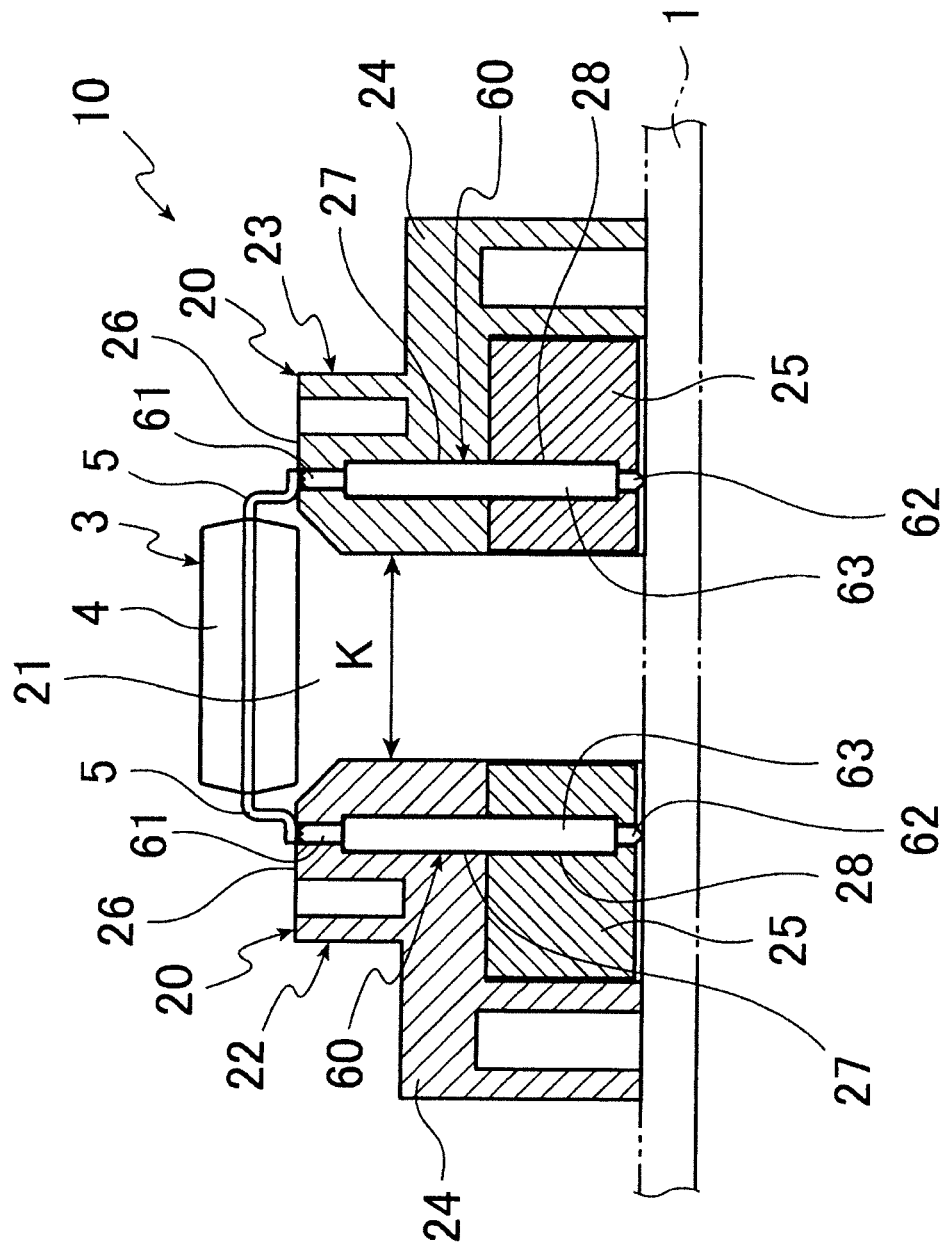

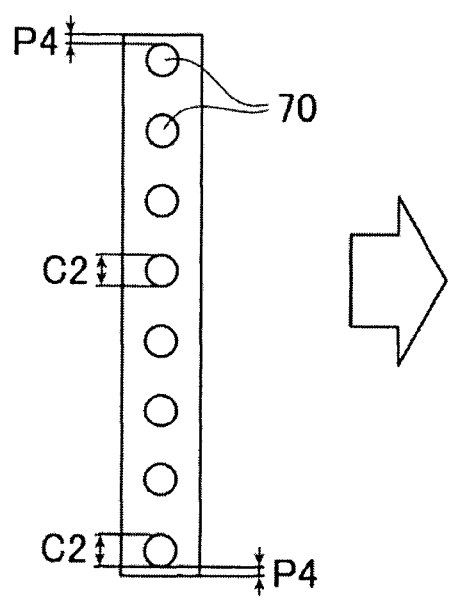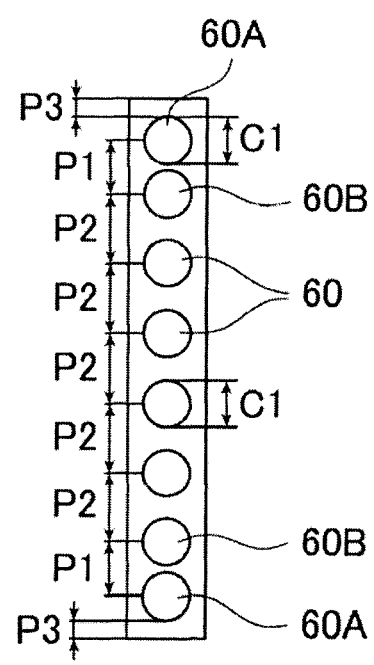

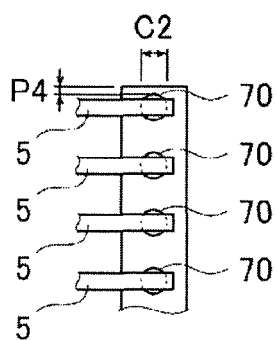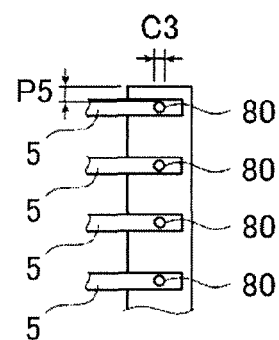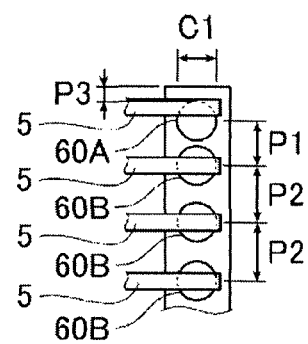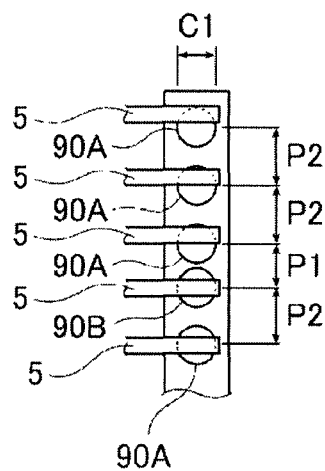

ELECTRICAL COMPONENT SOCKET

CROSS-REFERENCE TO RELATED APPLICATION

This application is a U.S. National Stage Application which claims the benefit under 35 U.S.C. § 371 of PCT International Patent Application No. PCT/JP2016/081691, filed Oct. 26, 2016, which claims the foreign priority benefit under 35 U.S.C. § 119 of Japanese Patent Application No. 2015-211766, filed Oct. 28, 2015, the contents of which are incorporated herein by reference.

TECHNICAL FIELD

The present invention relates to an electrical component socket arranged on a circuit board and configured to receive an electrical component such as a semiconductor device (hereinafter referred to as an "IC package") for a test or the like of the electrical component.

BACKGROUND ART

As an "electrical component socket" of this type, there has been an IC socket configured to receive an IC package being an "electrical component" detachably.

Some types of such an IC package include, for example, a body in a square shape and a plurality of terminals that are provided on a lateral side or a bottom side of this body at regular intervals.

In contrast, an IC socket is configured such that an IC package is received in a socket body, which includes a plurality of contact pins to be in contact with terminals of the IC package, the contact pins being arranged in a row with the same pitch as an arrangement pitch of the terminals of the IC package, and as a result, the contact pins can be in contact with the terminals of the IC package (see Patent Literature 1).

CITATION LIST

Patent Literature

Patent Literature 1: Japanese Patent Laid-Open No. 2005-24491

SUMMARY OF INVENTION

Technical Problem

However, in some conventional IC sockets, a plurality of contact pins are arranged in a small area with a narrow pitch. Therefore, for example, a contact pin arranged at an end portion of a contact pin row is to be arranged being very close to a boundary of a receiving portion of an IC socket. As a result, there is the risk of the occurrence of such a defect that this contact pin at the end portion is likely to come into contact with another device that is arranged being close to the IC socket.

Meanwhile, when a diameter of contact pins is decreased to increase a distance between an outer circumferential surface of the contact pins and an outer edge of an IC socket, there is the risk that a poor contact occurs between the contact pins and terminals of an IC package.

The present invention thus has an objective to provide an electrical component socket that includes a plurality of contact pins arranged in a small area with a narrow pitch, enables, with a simple structure, the contact pins to be kept from contact with another device, and enables the stability of contact between the contact pins and terminals of an electrical component to be achieved.

Solution to Problem

To achieve such an objective, the present invention is an electrical component socket that is arranged on a circuit board and configured to receive an electrical component including a body with a plurality of terminals arranged at regular intervals, the electrical component socket including: a socket body that is arranged on the circuit board and includes a receiving portion configured to receive the electrical component, wherein the socket body includes an arrangement portion in which a row of a plurality of contact pins to be in contact with the terminals of the electrical component is arranged, and at least one of arrangement pitches between the plurality of contact pins is narrower than a pitch between the terminals of the electrical component, and other arrangement pitches are substantially equal to the pitch between the terminals of the electrical component.

In the present invention, it is desirable that surfaces of the contact pins to be in contact with the terminals of the electrical component are formed to have a diameter sufficiently large enough to allow the surfaces to be in contact with the corresponding terminals.

In the present invention, it is desirable that an arrangement pitch between one or more of the contact pins arranged at one or both ends of the row of the contact pins and one or more of the contact pins adjacent to and inward of the one or more of the contact pins arranged at one or both ends of the row of the contact pins is made to be narrower than a pitch between the terminals of the electrical component.

In the present invention, any one or more of arrangement pitches between the contact pins arranged at positions other than both ends of the row of the contact pins may be made to be narrower than the pitch between the terminals of the electrical component.

In the present invention, it is desirable that the arrangement portion in a rectangular shape is formed protruding from the socket body, and the row of the contact pins is arranged in the arrangement portion.

In the present invention, it is desirable that the row of the contact pins is formed by the plurality of contact pins arranged in a straight line pattern.

In the present invention, the plurality of contact pins may be arranged in a staggered pattern.

Advantageous Effects of Invention

According to the present invention, since at least one of the arrangement pitches is made to be narrower than the pitch between the terminals of the electrical component, it is possible to keep the contact pins from contact with another device outside of arrangement positions of the pins, with a simple structure.

In the present invention, for some contact pins of which centers no longer match the centers of corresponding terminals of the electrical component due to narrowing some of the arrangement pitches, the stability of contact between the some contact pins and the corresponding terminals of the electrical component can be ensured by increasing the diameter of the some contact pins to increase the areas allowing the contact with the terminals of the corresponding electrical component.

In the present invention, an arrangement pitch between one or more of the contact pins at one or both ends of the row of the contact pins and one or more of the contact pins adjacent to and inward of the one or more of the contact pins arranged at one or both ends of the row of the contact pins is narrowed, which enables the contact pins to be kept from contact with another device outside of arrangement positions of the contact pins, by a simple, limited change.

In the present invention, it is possible to keep the contact pins from contact with another device outside arrangement positions of the contact pins by such a simple, limited change that narrows arrangement pitches between contact pins other than contact pins at both ends.

In the present invention, the arrangement portion in a rectangular shape is formed protruding from the socket body, which enables the contact pins to be kept from contact with another arranged device.

In the present invention, the above-described effects can be obtained whether the row of the contact pins is in a straight line pattern or a staggered pattern.

BRIEF DESCRIPTION OF DRAWINGS

FIG. 1 is a plan view of an IC socket according to an embodiment of the present invention.

FIG. 2 is a side view of the IC socket according to the embodiment as viewed in a direction of an arrow A in FIG. 1.

FIG. 3 is a cross-sectional view of the IC socket according to the embodiment taken along a line B-B in FIG. 1.

FIG. 4 is a cross-sectional view of the IC socket according to the embodiment, where the IC socket in a state illustrated in FIG. 3 receives an IC package.

FIGS. 5A and 5B schematically illustrates the arrangement of contact pins of the IC socket according to the embodiment, where FIG. 5A is a plan view illustrating an arrangement in accordance with an arrangement pitch in conventional practices, and FIG. 5B is a plan view illustrating an arrangement in accordance with an arrangement pitch of an embodiment 1.

FIG. 6A is a front view, and FIG. 6B is a plan view.

FIGS. 8A, 8B, and 8C are diagrams for description of the principle of the embodiment, where FIG. 8A is a plan view of a state where leads of an IC package are brought into contact with contact pins disposed with a conventional arrangement pitch, illustrating the state in a partially enlarging manner, FIG. 8B is a plan view of a state where leads of an IC package are brought into contact with contact pins disposed with an arrangement pitch in a comparative example, illustrating the state in a partially enlarging manner, and FIG. 8C is a plan view of a state where leads of an IC package are brought into contact with contact pins disposed with an arrangement pitch in the embodiment 1, illustrating the state in a partially enlarging manner.

FIG. 9 is a schematic diagram of a modification of the arrangement pitch for the contact pins in the IC socket according to the embodiment.

DESCRIPTION OF EMBODIMENT

Hereinafter, an embodiment of the present invention will be described.

FIG. 1 to FIG. 6B illustrate an embodiment of the present invention.

First, the configuration of the present embodiment will be described. An IC socket 10 as an "electrical component socket" of the present embodiment is configured to be arranged on a circuit board 1, as illustrated in FIG. 3 and other drawings. In addition, the IC socket 10 is configured to receive an IC package 3 as an "electrical component" (see FIGS. 6A and 6B) to electrically connect electrodes (not illustrated) of the circuit board 1 and leads 5 as "terminals" of the IC package 3. The IC socket 10 is used in, for example, a burn-in test or the like of the IC package 3.

Figure 6A:
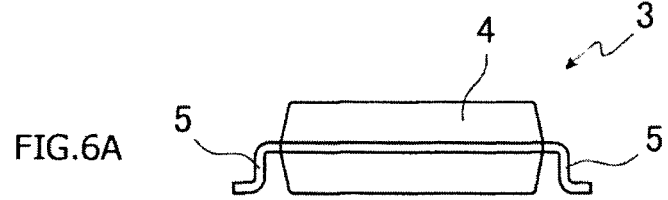
FIGS. 6A and 6B are diagrams illustrating an IC package according to the embodiment, where
Figure 6B:
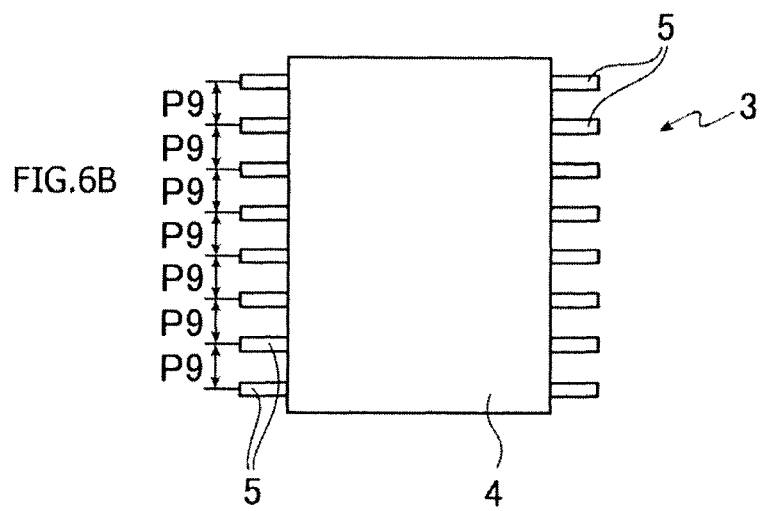

The IC package 3 of the present embodiment is referred to as a gull-wing type as illustrated in FIGS. 6A and 6B, including a body 4 that is formed in a rectangular shape in plan view and a plurality of leads 5 formed at regular intervals and protruding laterally in a crank shape from two opposing sides of this body 4.

Meanwhile, the IC socket 10 includes, as illustrated in FIG. 1 to FIG. 3, a socket body 20 to be fixed on the circuit board 1 and a receiving portion 21 on an upper-surface side of the socket body 20, the receiving portion 21 being configured to receive the IC package 3.

More specifically, the socket body 20 is formed by two members 22 and 23 opposing in plan view, as illustrated in FIG. 1 and other drawings. In addition, the two members 22 and 23 are fixed to the circuit board 1 with screws N1 such that the two members 22 and 23 share a gap K therebetween, and the gap K and inner-upper surfaces of the two members 22 and 23 form the receiving portion 21 to receive the IC package 3.

In addition, as illustrated in FIG. 3 and other drawings, the two members 22 and 23 each include an upper plate 24 forming an upper portion and an outer portion of the socket body 20, and a bottom plate 25 arranged below the upper plate 24 and forming a lower portion and an inner portion of the socket body 20. In addition, the upper plates 24 and the bottom plates 25 are fixed to each other with screws N2.

In addition, as illustrated in FIGS. 1 and 2, in the upper plates 24, inner-upper portions forming the receiving portion 21 include arrangement portions 26 that are formed in a rectangular shape and in parallel to each other, and protrude upward from other parts of the socket body 20, and on which contact pins 60 are arranged. In addition, in the arrangement portion 26 in the upper plate 24 and at a predetermined position in the bottom plate 25 corresponding to the arrangement portion 26, insertion holes 27 and 28 are formed laying in a row in a straight line along an inner side of the socket body 20. Into these insertion holes 27 and 28, the respective contact pins 60 are inserted and held, and this configures an arrangement in which the plurality of contact pins 60 are arranged in a row in a straight line in a lengthwise direction of the arrangement portion 26 of the socket body 20.

These contact pins 60 are configured to be in contact with lower surfaces of the leads 5 of the IC package 3 and to be electrically connected to electrodes of the circuit board 1. More in detail, in each of the contact pins 60, as illustrated in FIG. 3, an upper-side contact member 61 and a lower-side contact member 62 are inserted into a cylindrical shape portion 63 in such a manner that the upper-side contact member 61 and the lower-side contact member 62 can freely retract or project, the upper-side contact member 61 being made of a conductive metallic material and configured to be in contact with a lead 5 of the IC package 3, the lower-side contact member 62 being made of a conductive metallic material and configured to be in contact with an electrode (not illustrated) of the circuit board 1, and a coil spring (not illustrated) is arranged between the upper-side contact member 61 and the lower-side contact member 62 to urge them into a direction of separating them. In addition, the upper-side contact members 61 are configured to move vertically in the insertion holes 27 in the upper plate 24, and the lower-side contact members 62 are configured to move vertically in the insertion holes 28 in the bottom plate 25.

In addition, these contact pins 60 are arranged in a row with two arrangement pitches P1 and P2 (see FIG. 5B). Of these arrangement pitches P1 and P2, the arrangement pitch P2 is the same as a pitch P9 (see FIGS. 6A and 6B) for the leads 5 of the IC package 3. In contrast, the arrangement pitch P1 is narrower than the pitch P9 for the leads 5 of the IC package 3. In the present embodiment, the arrangement pitch P1 between contact pins 60A arranged at endmost positions of a contact pin row and contact pins 60B adjacent to and inward of the contact pins 60A is set narrower than the arrangement pitch P2 between the other contact pins 60.

By making the arrangement pitch P1 between the contact pins 60A arranged at the endmost positions of the contact pin row and the contact pins 60B arranged at positions inward of the contact pins 60A narrower than the other arrangement pitch P2, as illustrated in FIG. 5B, distances P3 between the contact pins 60A arranged at the endmost positions of the contact pin row and edges of the arrangement portion 26 are increased as compared with distances P4 in conventional practices illustrated in FIG. 5A.

As a result, even in a case where other devices or components are arranged outside both edges of the arrangement portion 26, there is a low possibility that the devices or the like come into contact with the contact pins 60A at the endmost positions of the contact pin row.

Furthermore, narrowing the arrangement pitch P1 enables a diameter C1 of upper-side contact members 61 of the contact pins 60A to be made larger than a diameter C2 of upper-side contact members of contact pin 70 in conventional practices, without reducing the distances between the endmost contact pins 60A and the edges of the arrangement portion 26.

As a result, in the present embodiment, a sufficient contact area can be ensured although contact positions between the contact pins 60A and the leads 5 are shifted.

As illustrated in FIG. 8A, in the contact pins 70 in conventional practices, all arrangement pitches (i.e., P2) match the pitch P9 for the leads 5, and each of the contact pins 70 can be thus brought into contact with a lead 5 at an almost center of the contact pin 70. In contrast, in a conventional IC socket, the distances P4 between the endmost contact pins 70 and the edges of the arrangement portion 26 cannot be increased sufficiently.

In contrast, as illustrated in FIG. 8B, reducing the diameter C3 of contact pins 80 enables distances P5 between endmost contact pins 80 and the edges of the arrangement portion 26 to be increased. However, in the example illustrated in FIG. 8B, a contact area of the contact pins 80 and the leads 5 becomes very small.

In contrast, in the present embodiment, as illustrated in FIG. 8C, by reducing the arrangement pitch P1 between contact pins 60A arranged at the endmost positions of the contact pin row and contact pins 60B arranged inward of the contact pins 60A, the distances P3 between these contact pins 60A and the edges of the arrangement portion 26 is increased. Therefore, in the present embodiment, leads 5 at endmost positions are to be in contact with these contact pins 60A at positions deviating from the centers of the contact pins 60A. However, in the present embodiment, as described above, since the diameter C1 of the upper-side contact members 61 of the contact pins 60A is made larger than the diameter C2 (see FIG. 8A) of the upper-side contact members of the contact pins 70 in conventional practices, as to the contact area of the contact pins 60A and the leads 5, the distances between the leads 5 in the lengthwise direction is longer than a distance in the case of the conventional contact pins 70 (i.e., C2). Therefore, in the present embodiment, a sufficient contact area can be ensured although the contact positions between the contact pins 60A and the leads 5 are shifted.

Note that, in the present embodiment, the upper-side contact members 61 of the contact pins 60A at the both ends are made to have the diameter C1, and the diameter of the upper-side contact members 61 of the other contact pins 60B is also made to C1 being the same value as the diameter of the upper-side contact members 61 of the contact pins 60A, for improving a production efficiency. In the present embodiment, the diameter C1 of the contact pins 60 is set at 0.5 mm, which is larger than the diameter C2 of the upper-side contact member 61 in the conventional contact pins 70, which is 0.4 mm, by about 20%.

The arrangement pitches P1 and P2 for the contact pins 60 and the pitch P9 for the leads 5 will be described specifically. The contact pins 60 having a diameter of 0.5 mm are arranged in a row in the arrangement portion 26, and the arrangement pitch P2, other than the arrangement pitch P1 between the contact pins 60A at the ends of the contact pin row and the adjacent contact pins 60B, is set at 1.27 mm, which is the same as the pitch P9 for the leads 5. In addition, the arrangement pitch P1 between the contact pins 60A at the ends and the adjacent contact pins 60B is set at 1.17 mm, which is narrower by 0.1 mm.

Next, actions of the IC socket 10 having such a configuration will be described.

First, as illustrated in FIG. 3, the IC socket 10 before receiving the IC package 3 is in a state where the contact pins 60 arranged in a row in the arrangement portion 26 are urged upward by the coil springs to protrude from the upper face of the receiving portion 21.

Next, using a jig (not illustrated) or the like, the IC package 3 is received in the receiving portion 21. Then, the jig or the like presses down IC package 3, with the leads 5 abutting on the upper-side contact members 61 of the contact pins 60. The upper-side contact members 61 are thereby pressed from the upper face of the receiving portion 21 to below the upper face as illustrated in FIG. 4, so that a predetermined contact pressure is ensured. In this state, a burn-in test or the like is conducted by causing current to flow in the IC package 3.

Subsequently, after the burn-in test or the like is finished, the pressing jig or the like is moved upward, and then the IC package 3 is taken out of the receiving portion 21.

As seen from the above, in the IC socket 10 of the present embodiment, the two arrangement pitches P1 and P2 are set as the arrangement pitches for the contact pins 60 arranged in a row in the arrangement portion 26 in a rectangular shape, and the arrangement pitch P1 (which is here an arrangement pitch between the contact pins 60A at the endmost position of the contact pin row and the contact pins 60B adjacent to and inward of the contact pins 60A) is made shorter than the pitch P9 for the leads 5 of the IC, and the arrangement pitch P2 (which is here an arrangement pitch between the contact pins 60B, other than the contact pins 60A) is made the same as the pitch P9 for the leads 5 of the IC package 3. Therefore, with a simple structure in which only the arrangement pitch P1 for the contact pins 60 for some leads 5 is made narrow, the distance P3 between the contact pins 60A at both ends of the row and the edges of the arrangement portion 26 can be increased. Therefore, even in a case where other devices or components are arranged outside both edges of the arrangement portion 26, it is possible to keep the devices or the like from contact with the contact pins 60A at the endmost positions of the contact pin row.

Furthermore, as described above, since the diameter C1 of the upper-side contact members 61 of the contact pins 60A is made larger than the diameter C2 of the upper-side contact members of the conventional contact pins 70, a sufficient contact area can be ensured although the contact positions between the contact pins 60A and the leads 5 are shifted.

In addition, in the present embodiment, as illustrated in FIG. 5B, the upper-side contact members 61 of the other contact pins 60B are also made to have the same diameter C1 as that of the contact pins 60A. This enables the contact pins 60 and the leads 5 to be reliably in contact with one another, and equalizing the diameters of all of the contact pins 60 enables the intention of improving the production efficiency.

In addition, in the IC socket 10 of the present embodiment, since the arrangement portion 26 in a rectangular shape is formed protruding from the socket body 20, and the contact pins 60 are arranged in a row in the arrangement portion 26, the contact pins 60 are arranged at protruding positions where other parts hardly interfere with the contact pins 60, which enables the contact pins 60 to be more reliably kept from contact with another device or the like outside the contact pins 60.

Next, a modification of the present embodiment will be described with reference to FIG. 7.

In the embodiment described above, the description is made about the arrangement in which the contact pins 60 are arranged in a row in a straight line, but it should be understood that the embodiment includes an arrangement in which contact pins are arranged not in a row and do not overlap with one another.

Figure 7:
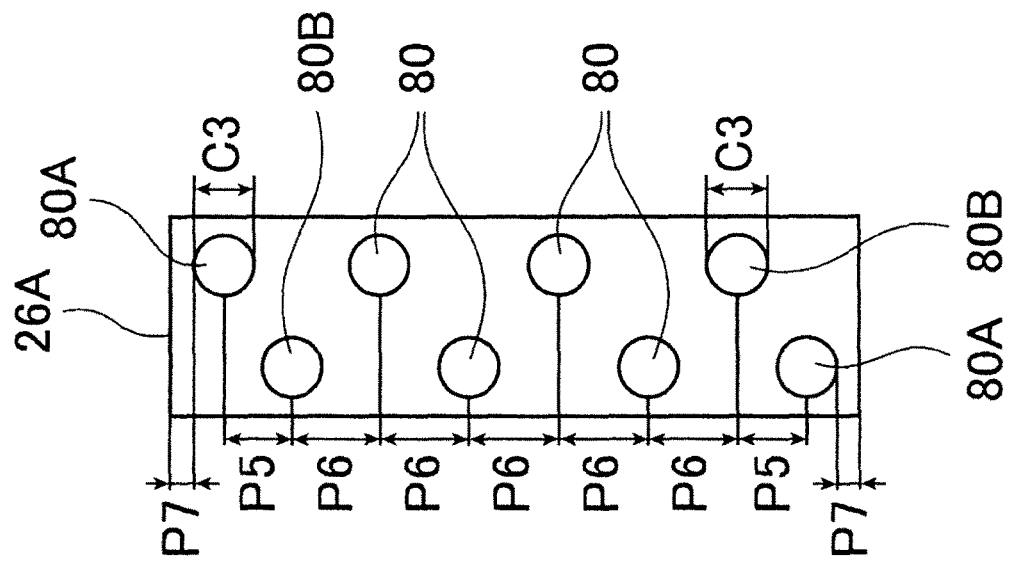
FIG. 7 is a schematic diagram of a modification of the arrangement pitch for the contact pins in the IC socket according to the embodiment.

Specific examples of such an arrangement include, as in the modification illustrated in FIG. 7, an arrangement in which contact pins 80 are arranged in a staggered pattern such that they do not overlap with one another, where an arrangement pitch P5 between contact pins 80A arranged at end positions of a contact pin row and contact pins 80B adjacent to and inward of the contact pins 80A obliquely is set narrower than an arrangement pitch P6 between other obliquely adjacent contact pins 80.

In addition, at this point, the arrangement pitch P5 between the contact pins 80A arranged at endmost positions of the contact pin row and the contact pins 80B adjacent to and inward of the contact pins 80A is made to be narrower than the other arrangement pitch P6, and accordingly, a distance P7 between the contact pins 80A arranged at the end positions and edges of an arrangement portion 26A is configured to be large as compared with a conventional distance P4 (see FIG. 5A).

As a result, even in a case where other devices or components are arranged outside both edges of the arrangement portion 26, there is a low possibility that the devices or the like come into contact with the contact pins 80A at the endmost positions of the contact pin row.

In addition, also in the example illustrated in FIG. 7, a diameter C3 of the contact pins 80A is formed to be larger by a predetermined amount. As a result, areas allowing contact with the leads 5 of the IC package 3, which improves the stability of the contact. In addition, all of the contact pins 80A and 80B are formed to have the same size, for improving a production efficiency.

Although, in the embodiment described above, the present invention is applied to the IC socket 10 as the "electrical component socket", it should be noted that the application is not limited to this, and of course, the present invention is applicable to other devices.

In addition, in the embodiment described above, the arrangement pitch P1 between the contact pins 60A at both ends of the contact pin row and the adjacent contact pins 60B is configured to be narrower than the other arrangement pitch P2, but the embodiment is not limited to this configuration, and only an arrangement pitch P1 between a contact pin 60A at one end of the contact pin row and a contact pin 60B adjacent to the contact pin 60A may be configured to be narrower than another arrangement pitch P2 as the need such as that from the shape of the IC socket 10 arises.

In addition, in the embodiment described above, the arrangement P1 between the contact pins 60A at the ends of the row and the adjacent contact pins 60B is configured to be narrower than the other arrangement pitch P2, but the embodiment is not limited to this configuration, and an arrangement pitch between contact pins other than the contact pins at the ends may be made to be narrower than another arrangement pitch. In an example illustrated in FIG. 9, an arrangement pitch P1 between a contact pin 90A at a third endmost position and a contact pin 90B at a fourth endmost position is set narrower than an arrangement pitch P2 between other contact pins.

In a case of this example, it is desirable that the diameter of the contact pins at first to third endmost positions is made to be larger than the diameter C2 of the conventional contact pins so that contact areas with the leads 5 are made to be sufficiently large. However, for improving a production efficiency, all of the contact pins may be made to have a large diameter C1 as illustrated in FIG. 9.

Such a configuration also provides the same effects as those of the embodiment 1 described above.

In addition, the number of locations where arrangement pitches are made to be narrower than the others is not limited to one or two, and may be three or more in some cases.

In addition, in the embodiment described above, the description is made about the IC socket 10 for receiving, as the IC package, an IC package what is called an SOP in which the plurality of leads 5 are formed at regular intervals to protrude laterally in a crank shape from the two opposing sides of the body 4. However, the present invention is not limited to such an IC socket and is applicable to IC sockets for receiving other types of IC packages.

In addition, in the embodiment described above, the description is made about the IC package 3 as the electrical component, but the electrical component is not limited to this, and the present invention may be applied to other electrical components.

REFERENCE SIGNS LIST 1 circuit board
3 IC package (electrical component)
4 body
5 lead (terminal)
10 IC socket (electrical component socket)
20 socket body
21 receiving portion
26, 26A arrangement portion
60, 80, 90 contact pin

The invention claimed is:

1. An electrical component socket comprising:
a socket body configured to receive an electrical component having terminals arranged at regular intervals; and
contact pins extending through the socket body so that each of the contact pins has a first end passing through a first side of the socket body and a second end passing through a second side of the socket body,
wherein the electrical component socket is arrangeable on a circuit board having terminals so that, when the electrical component socket is arranged on the circuit board with the electrical component received by the socket body,
the first end of each of the contact pins passing through the first side of the socket body contacts a terminal of the terminals of the electrical component and the second end of each of the contact pins passing through the second side of the socket body contacts a terminal of the terminals of the circuit board, and
a pitch at the first side of the socket body between at least two adjacent contact pins of the contact pins is narrower than a pitch between the terminals of the electrical component, and a pitch at the first side of the socket body between adjacent contact pins, other than the at least two adjacent contact pins, of the contact pins is substantially equal to the pitch between the terminals of the electrical component.

2. The electrical component socket according to claim 1, wherein surfaces of the contact pins to be in contact with the terminals of the electrical component have a diameter of a size that allows the surfaces to be in contact with the terminals of the electrical component, respectively.

3. The electrical component socket according to claim 1, wherein
the contact pins are arranged in a row, and
the at least two adjacent contact pins includes contact pins arranged at one or both ends of the row and one or more of the contact pins adjacent to and inward of the contact pins arranged at one or both ends of the row.

4. The electrical component socket according to claim 1, wherein
the contact pins are arranged in a row, and
the at least two adjacent contact pins includes contact pins arranged at positions other than at ends of the row.

5. The electrical component socket according to claim 1, wherein the socket body includes an arrangement portion in a rectangular shape protruding from the socket body to receive the electrical component, and the contact pins are arranged in the arrangement portion.

6. The electrical component socket according to claim 1, wherein the contact pins are arranged in a straight line pattern.

7. The electrical component socket according to claim 1, wherein contact pins are arranged in a staggered pattern.

8. The electrical component socket according to claim 1, wherein
the contact pins are arranged in a row having first and second ends, and
the at least two adjacent contact pins includes a last two contact pins at the first end of the row, and a last two contact pens at the second end of the row.

9. The electrical component socket according to claim 2, wherein
the contact pins are arranged in a row, and
the at least two adjacent contact pins includes contact pins arranged at one or both ends of the row and one or more of the contact pins adjacent to and inward of the one or more of the contact pins arranged at one or both ends of the row.

10. The electrical component socket according to claim 2, wherein
the contact pins are arranged in a row, and
the at least two adjacent contact pins includes contact pins arranged at positions other than at both ends of the row.

11. The electrical component socket according to claim 3, wherein the socket body includes an arrangement portion in a rectangular shape protruding from the socket body to receive the electrical component, and the contact pins are arranged in the arrangement portion.

12. The electrical component socket according to claim 3, wherein the contact pins are arranged in a straight line pattern.

13. The electrical component socket according to claim 4, wherein the socket body includes an arrangement portion in a rectangular shape protruding from the socket body to receive the electrical component, and the contact pins are arranged in the arrangement portion.

14. The electrical component socket according to claim 4, wherein the contact pins are arranged in a straight line pattern.

15. An electrical component socket that is arrangeable on a circuit board and configured to receive an electrical component including a body with a plurality of terminals arranged at regular intervals, the electrical component socket comprising:
a socket body that is arrangeable on the circuit board and includes a receiving portion configured to receive the electrical component, wherein
the socket body includes an arrangement portion in which a row of a plurality of contact pins to be in contact with the terminals of the electrical component is arranged,
at least one of arrangement pitches between the plurality of contact pins is narrower than a pitch between the terminals of the electrical component, and other arrangement pitches are substantially equal to the pitch between the terminals of the electrical component, and
an arrangement pitch between one or more of the contact pins arranged at one or both ends of the row of the contact pins and one or more of the contact pins adjacent to and inward of the one or more of the contact pins arranged at one or both ends of the row of the contact pins is made to be narrower than a pitch between the terminals of the electrical component.

16. An electrical component socket that is arrangeable on a circuit board and configured to receive an electrical component including a body with a plurality of terminals arranged at regular intervals, the electrical component socket comprising:
a socket body that is arrangeable on the circuit board and includes a receiving portion configured to receive the electrical component, wherein
the socket body includes an arrangement portion in which a row of a plurality of contact pins to be in contact with the terminals of the electrical component is arranged,
at least one of arrangement pitches between the plurality of contact pins is narrower than a pitch between the terminals of the electrical component, and other arrangement pitches are substantially equal to the pitch between the terminals of the electrical component, surfaces of the contact pins to be in contact with the terminals of the electrical component are formed to have a diameter of a size that allows the surface to be in contact with the terminals, and an arrangement pitch between one or more of the contact pins arranged at one or both ends of the row of the contact pins and one or more of the contact pins adjacent to and inward of the one or more of the contact pins arranged at one or both ends of the row of the contact pins is made to be narrower than a pitch between the terminals of the electrical component.

* * * * *

UNITED STATES PATENT AND TRADEMARK OFFICE
CERTIFICATE OF CORRECTION

PATENT NO. : 10,431,947 B2
APPLICATION NO. : 15/771745
DATED : October 1, 2019
INVENTOR(S) : Yuta Sugawara Page 1 of 1

It is certified that error appears in the above-identified patent and that said Letters Patent is hereby corrected as shown below:

In the Claims

Column 9, Line 61:
In Claim 8, delete "pens" and insert -- pins --, therefor.

Signed and Sealed this
Nineteenth Day of November, 2019

Andrei Iancu
*Director of the United States Patent and Trademark Office*